(12) United States Patent
Tsai et al.

(10) Patent No.: US 10,811,396 B2
(45) Date of Patent: Oct. 20, 2020

(54) DISPLAY DEVICE

(71) Applicant: Lextar Electronics Corporation, Hsinchu (TW)

(72) Inventors: Cheng-Yu Tsai, Hsinchu (TW); Jian-Chin Liang, Hsinchu (TW); Jo-Hsiang Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 14 days.

(21) Appl. No.: 16/252,690

(22) Filed: Jan. 20, 2019

(65) Prior Publication Data
US 2020/0235075 A1 Jul. 23, 2020

(51) Int. Cl.
| | | |
|---|---|---|
| *H01J 1/62* | (2006.01) | |
| *H01J 63/04* | (2006.01) | |
| *G02B 5/02* | (2006.01) | |
| *G02F 1/1335* | (2006.01) | |
| *G02B 5/30* | (2006.01) | |
| *H01L 25/075* | (2006.01) | |
| *G02B 1/11* | (2015.01) | |
| *H01L 33/58* | (2010.01) | |
| *H01L 33/48* | (2010.01) | |

(52) U.S. Cl.
CPC .......... *H01L 25/0753* (2013.01); *G02B 1/11* (2013.01); *H01L 33/483* (2013.01); *H01L 33/58* (2013.01); *H01L 2933/0091* (2013.01)

(58) Field of Classification Search
CPC ........ B29D 11/00288; B29D 11/00798; B29D 11/00865; B29D 11/00298; B29D 11/00365; G02F 1/133504; G02F 1/133526; G02F 2001/133507; G02B 6/0051; G02B 6/0053; B29C 2059/023; B29C 59/022; B29C 59/046; B29C 59/002; B29C 33/424; B29C 2035/0827; B29C 33/3842; B29K 2105/256; B29K 2995/0026

See application file for complete search history.

(56) References Cited

U.S. PATENT DOCUMENTS

| 5,268,788 A | 12/1993 | Fox et al. |
| 2009/0040611 A1 | 2/2009 | Kitamura et al. |
| 2010/0134733 A1* | 6/2010 | Watanabe ........ B29D 11/00798 349/112 |
| 2010/0163898 A1* | 7/2010 | Hung .................... H01L 33/507 257/98 |
| 2011/0284907 A1* | 11/2011 | Nakamura .......... H01L 51/5268 257/98 |

(Continued)

FOREIGN PATENT DOCUMENTS

| CN | 1447134 A | 10/2003 |
| CN | 204790248 U | 11/2015 |

(Continued)

*Primary Examiner* — Brian Turner
(74) *Attorney, Agent, or Firm* — CKC & Partners Co., LLC

(57) ABSTRACT

A display device includes a substrate, a light-emitting member, and an anti-reflective glass layer. The light-emitting member is on the substrate. The anti-reflective glass layer is over the light-emitting member, and the anti-reflective glass layer has a transmittance of 40-95%. The anti-reflective glass layer includes a glass layer and a light-absorbing layer. The glass layer has a rough top surface and a haze of 70-80%. The light-absorbing layer is on the rough top surface of glass layer.

12 Claims, 6 Drawing Sheets

(56) References Cited

U.S. PATENT DOCUMENTS

| | | | |
|---|---|---|---|
| 2012/0001204 A1* | 1/2012 | Jagt | H01L 33/504 |
| | | | 257/88 |
| 2016/0097881 A1 | 4/2016 | Yang et al. | |
| 2016/0329527 A1 | 11/2016 | Yang et al. | |
| 2017/0250374 A1* | 8/2017 | Tokuda | H01L 27/323 |
| 2018/0267357 A1 | 9/2018 | Ohori et al. | |
| 2018/0292066 A1 | 10/2018 | Rinko | |
| 2018/0351034 A1* | 12/2018 | Kuo | H01L 33/507 |
| 2019/0155095 A1* | 5/2019 | Chen | G02B 1/113 |
| 2019/0179591 A1* | 6/2019 | Kuo | G06F 3/1446 |
| 2019/0371974 A1* | 12/2019 | Hussell | H01L 25/0753 |

FOREIGN PATENT DOCUMENTS

| | | |
|---|---|---|
| TW | 201336796 A | 9/2013 |
| WO | 2014058690 A1 | 4/2014 |
| WO | 2015012223 A1 | 1/2015 |
| WO | 2018114368 A1 | 6/2018 |
| WO | 2018140417 A1 | 8/2018 |

* cited by examiner

DISPLAY DEVICE

BACKGROUND

Field of Invention

The present invention relates to a display device.

Description of Related Art

In recent years, due to the breakthrough in production size for the light emitting diode (LED), a micro LED display panel or a mini LED display panel is gradually being given weight to. In conventional micro/mini LED display devices, the LED chips are surrounded with an opaque (usually black) encapsulant to enhance the contrast ratio of the display devices and to decrease the intensity of the reflected light resulting from the ambient lights. However, the total area of the opaque encapsulant is over 85% of the area of display device. The brightness of the display devices is therefore decreased because a large amount of lights emitted from the LED chips is absorbed by the opaque encapsulant.

SUMMARY

In accordance with an aspect of the present invention, a display device is provided. The display device includes a substrate, a light-emitting member, and an anti-reflective glass layer. The light-emitting member is on the substrate. The anti-reflective glass layer is over the light-emitting member, and the anti-reflective glass layer has a transmittance of 40-95%. The anti-reflective glass layer includes a glass layer having a rough top surface and a light-absorbing layer on the rough top surface of glass layer. The glass layer has a haze of 70-80%.

According to some embodiments of the present invention, the light-emitting member includes a red LED chip, a green LED chip, and a blue LED chip.

According to some embodiments of the present invention, a top of the light-emitting member is spaced apart from a bottom of the glass layer by a gap ranged from 100 µm to 150 µm.

According to some embodiments of the present invention, the light-absorbing layer includes a polymer and a plurality of first light-absorbing particles dispersed in the polymer.

According to some embodiments of the present invention, the display device further includes a circular polarizer layer between the light-emitting member and the glass layer.

According to some embodiments of the present invention, the display device further includes a transparent encapsulant layer between the light-emitting member and the glass layer, and surrounding the light-emitting member.

According to some embodiments of the present invention, the display device further includes a gray encapsulant layer between the light-emitting member and the glass layer, and surrounding the light-emitting member.

According to some embodiments of the present invention, the gray encapsulant layer includes an encapsulating material and a plurality of second light-absorbing particles dispersed in the encapsulating material, and the second light-absorbing particles is present in the encapsulating material at a weight percentage of about 0.1-0.5%.

In accordance with another aspect of the present invention, a display device is provided. The display device includes a first substrate, a second substrate, a first light-emitting member, a second light-emitting member, and an anti-reflective glass layer. The second substrate neighbors the first substrate, and a joint interface is present between the first substrate and the second substrate. The first light-emitting member and the second light-emitting member are respectively disposed on the first substrate and the second substrate. The anti-reflective glass layer is over the first and the second light-emitting members. The anti-reflective glass layer has a transmittance of 40-95% and includes a glass layer and a light-absorbing layer. The glass layer covers the first light-emitting member, the second light-emitting member and the joint interface, and the glass layer has a rough top surface and a haze of 70-80%. The light-absorbing layer is on the rough top surface of the glass layer.

According to some embodiments of the present invention, each of the first light-emitting member and the second light-emitting member includes a red LED chip, a green LED chip, and a blue LED chip.

According to some embodiments of the present invention, a top of the first light-emitting member and a top of the second light-emitting member is respectively spaced apart from a bottom of the glass layer by a gap ranged from 100 µm to 150 µm.

According to some embodiments of the present invention, the light-absorbing layer includes a polymer and a plurality of first light-absorbing particles dispersed in the polymer.

According to some embodiments of the present invention, the display device further includes a circular polarizer layer between the first and the second light-emitting members and the glass layer.

According to some embodiments of the present invention, the display device further includes a transparent encapsulant layer between the first and the second light-emitting members and the glass layer, and surrounding the first and the second light-emitting members.

According to some embodiments of the present invention, the display device further includes gray encapsulant layer between the first and the second light-emitting members and the glass layer, and surrounding the first and the second light-emitting members.

According to some embodiments of the present invention, the gray encapsulant layer includes a encapsulating material and a plurality of second light-absorbing particles dispersed in the encapsulating material, and the second light-absorbing particles is present in the encapsulating material at a weight percentage of about 0.1-0.5%.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
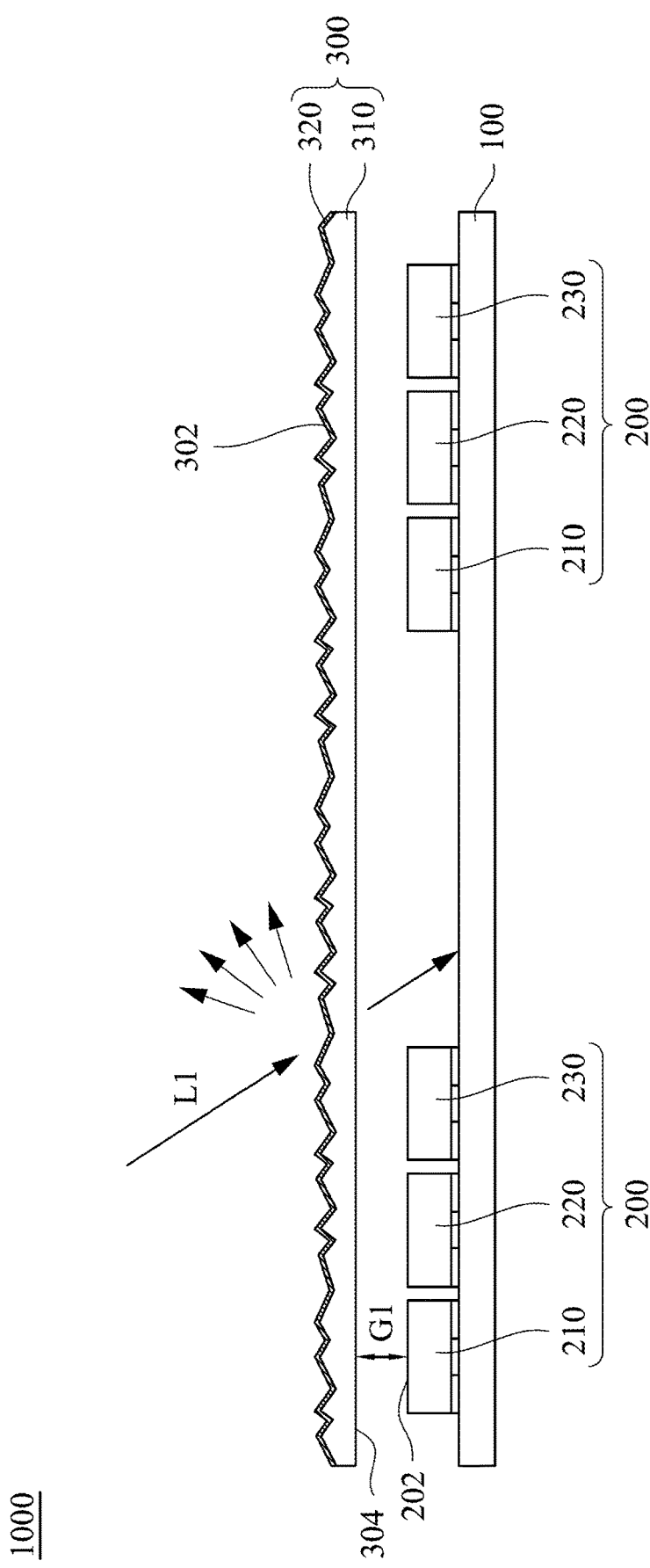
FIG. 1 is a schematic cross-sectional view of a display device in accordance with some embodiments of this invention.

Reference will now be made in detail to the present embodiments of the invention, examples of which are illustrated in the accompanying drawings. Wherever possible, the same reference numbers are used in the drawings and the description to refer to the same or like parts.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

FIG. 1 is a schematic cross-sectional view of a display device 1000 in accordance with some embodiments of this invention. The display device 1000 includes a substrate 100, a light-emitting member 200 on the substrate 100, and an anti-reflective glass layer 300 over the light-emitting member 200.

The substrate 100 may be any suitable substrate, such as glass fiber substrate, glass substrate, BT (Bismaleimide Triazine) substrate, ceramic substrate, metal core printed circuit board (MCPCB), or the like.

In some embodiments, the light-emitting member 200 may include LED chips. In some examples, the light-emitting member 200 may include red LED chips, green LED chips, and/or blue LED chips. For example, as shown in FIG. 1, the LED chips 210, 220 and 230 may be respectively red LED chips, green LED chips and blue LED chips. In some embodiments, each of the LED chips 210, 220 and 230 has a length which is less than 200 μm, a width which is less than 200 μm, and a height which is less than 100 μm.

The anti-reflective glass layer 300 includes a glass layer 310 and a light-absorbing layer 320. The glass layer 310 has a rough top surface 302 and a haze of 70-80%. For example, the haze of the glass layer 310 may be 70, 73, 75%, 77%, or 80%. The rough top surface 302 of the glass layer 310 may be formed by an etching method, a sandblast method, or the like. The incident ambient light L1 is scattered at the rough top surface 302 of the glass layer 310, such that a mirror reflection can be avoid. The haze of the rough top surface 302 of the glass layer 310 may affect the scattering of the incident ambient light L1. The display device may obtain fine display quality and scatter the incident ambient light L1 appropriately when the haze of the glass layer is in the range of 70-80%. In some embodiments, the glass layer 310 may be, but is not limited to, a physically or chemically strengthened glass. The glass layer can protect the display device 1000. As shown in FIG. 1, a top 202 of the light-emitting member 200 is spaced apart from a bottom 304 of the glass layer 310 by a gap G1. In some examples, the gap G1 may range from 100 μm to 150 μm. For example, the gap G1 may be 110, 120, 130, or 140 μm.

The light-absorbing layer 320 is on the rough top surface 302 of the glass layer 310. In some embodiments, the light-absorbing layer 320 may be formed on the rough top surface 302 of glass layer 310 by a suitable approach such as a coating process, a printing process, or the like. In some embodiments, the light-absorbing layer 320 may have a rough top surface that is substantially consistent with the rough top surface 302 of glass layer 310. In some embodiments, the light-absorbing layer 320 includes a polymer and a plurality of first light-absorbing particles dispersed in the polymer. In some examples, the first light-absorbing particles may include black particles such as black pigment or carbon black. In some embodiments, the light-absorbing layer 320 may be made from a printing ink that is suitable for coating on a glass material. The light-absorbing layer 320 can absorb a portion of the light L1 incident from the ambient environment, such that the intensity of the reflected light may be reduced.

The anti-reflective glass layer 300 has a transmittance of 40-95% for a visible light with a wavelength of 380-780 nm. For example, the transmittance of the anti-reflective glass layer 300 may be 42%, 45%, 50%, 55%, 60%, 65%, 68%, 70%, 75%, 80%, 85%, 90% or 92%. The transmittance of the anti-reflective glass layer 300 can be adjusted by changing the concentration of the first light-absorbing particles in the light-absorbing layer 320.

Figure 2:
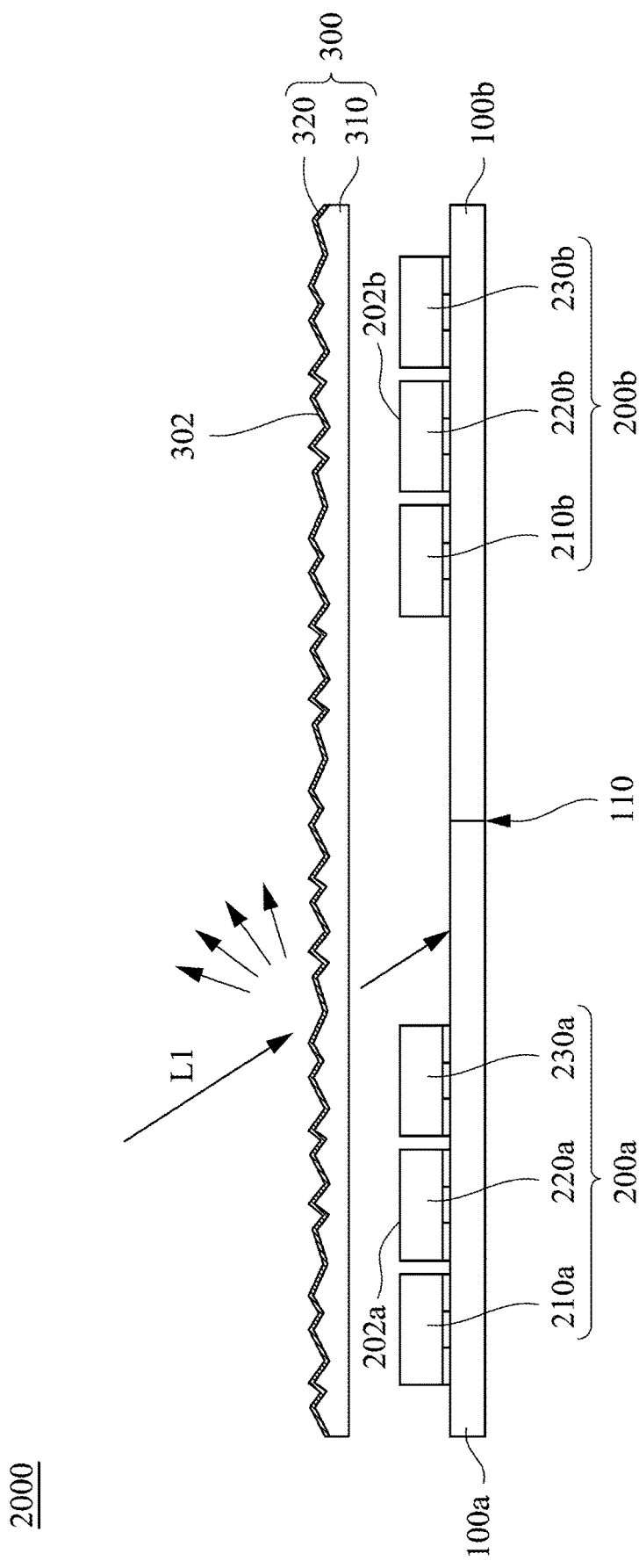
FIG. 2 is a schematic cross-sectional view of a display device in accordance with some embodiments of this invention.

Reference is made to FIG. 2, which is a schematic cross-sectional view of a display device 2000 in accordance with some embodiments of this invention. The display device 2000 includes a first substrate 100a, a second substrate 100b, a first light-emitting member 200a, a second light-emitting member 200b, and an anti-reflective glass layer 300. The difference between the display device 2000 and the display device 1000 shown in FIG. 1 is in that the display device 2000 includes a plurality of spliced substrates, such as the first substrate 100a and the second substrate 100b. As shown in FIG. 2, the second substrate 100b neighbors the first substrate 100a, and a joint interface 110 is present between the first substrate 100a and the second substrate 100b. Although FIG. 2 shows that the display device 2000 includes two substrates spliced to each other, it should be understood that the number of the substrate is not limited thereto. The number of the substrates and the arrangement thereof may be selected depending on need.

The first light-emitting member 200a is disposed on the first substrate 100a, and the second light-emitting member 200b is disposed on the second substrate 100b. The first light-emitting member 200a and the second light-emitting member 200b may be similar to the light-emitting member 200 as illustrated in FIG. 1. In some embodiments, the first light-emitting member 200a and the second light-emitting member 200b each includes a plurality of LED chips. For example, the first light-emitting member 200a includes red LED chips 210a, green LED chips 220a, and blue LED chips 230a, and the second light-emitting member 200b includes red LED chips 210b, green LED chips 220b, and blue LED chips 230b. In some embodiments, each of the LED chips 210a, 210b, 220a, 220b, 230a and 230b has a length which is less than 200 μm, a width which is less than 200 μm, and a height which is less than 100 μm.

The anti-reflective glass layer 300 is over the first and the second light-emitting members 200a and 200b. The anti-reflective glass layer 300 of the display device 2000 is similar to, or the same as the anti-reflective glass layer 300 of the display device 1000 shown in FIG. 1. The material and the structure of the anti-reflective glass layer 300 have been described above, and are not repeated hereinafter. The anti-reflective glass layer 300 covers the joint interface 110, such that the joint interface 110 is visually imperceptible. In a comparative example where the anti-reflective glass layer does not include a roughed surface, the joint interface is visible for a viewer.

Figure 3:
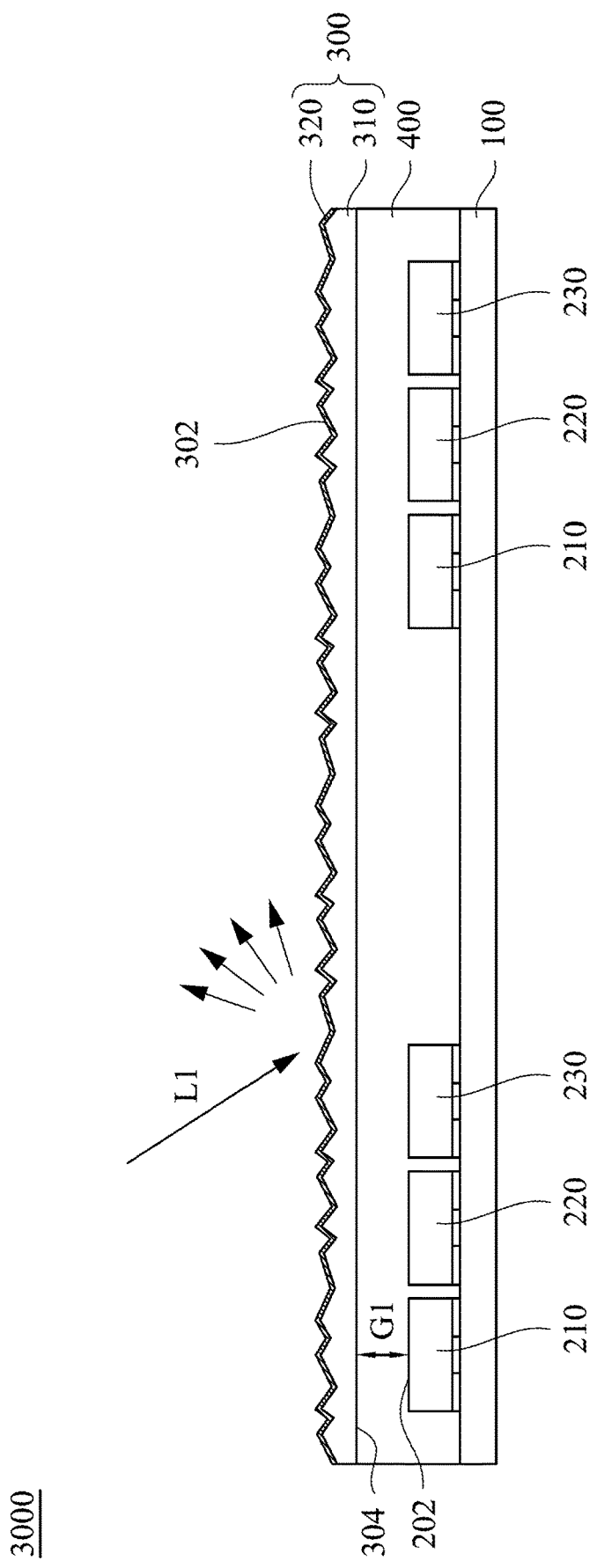
FIG. 3 is a schematic cross-sectional view of a display device in accordance with some embodiments of this invention.

Reference is made to FIG. 3, which is a schematic cross-sectional view of a display device 3000 in accordance with some embodiments of this invention. The difference between the display device 3000 and the display device 1000 shown in FIG. 1 is in that the display device 3000 further includes a gray encapsulant layer 400 between the light-emitting member 200 and the glass layer 310. The gray encapsulant layer 400 surrounds and covers the light-emitting member 200. In some embodiments, the gray encapsulant layer 400 includes an encapsulating material and a plurality of second light-absorbing particles dispersed in the encapsulating material. In some embodiments, the encapsulating material includes epoxy, silicone, resin, or the like. In some embodiments, the second light-absorbing particles include, but are not limited to, black particles such as black pigment or carbon black. In some embodiments, the second light-absorbing particles may be the same as the first light-absorbing particles in the light-absorbing layer 320. In other embodiments, the second light-absorbing particles may be different from the first light-absorbing particles. In some embodiments, the second light-absorbing particles is present in the encapsulating material at a weight percentage of about 0.1-0.5%. In some examples, the second light-absorbing particles is present in the encapsulating material at a weight percentage of about 0.2% when the distance G1 between the top 202 of the light-emitting member 200 and the bottom 304 of the glass layer 310 is about 100-150 μm.

The light-absorbing layer 320 can absorb a portion of the light L1 incident from ambient environment, such that the intensity of the reflected light may be reduced. In some embodiments, the light-absorbing layer 320 may be optionally removed. Further, the incident light L1 is scattered at the rough top surface 302 of the glass layer 310, such that a mirror reflection can be avoid. In addition, the gray encapsulant layer 400 surrounds each of the LED chips 210, 220, and 230, such that the second light-absorbing particles may absorb a portion of the light emitted from the light-emitting member 200 to improve the issue of cross talk of the light-emitting member 200. In addition, the gray encapsulant layer 400 may absorb a portion of the incident light L1 passing through the anti-reflective glass layer 300.

In other embodiments, the gray encapsulant layer 400 may be replaced by a transparent encapsulant layer. In some examples, the transparent encapsulant layer may include, but is not limited to epoxy, silicone, resin. In yet other embodiments, the gray encapsulant layer 400 and the transparent encapsulant layer discussed herein may be applied to the display device 2000 having joint interface 110 shown in FIG. 2.

Figure 4:
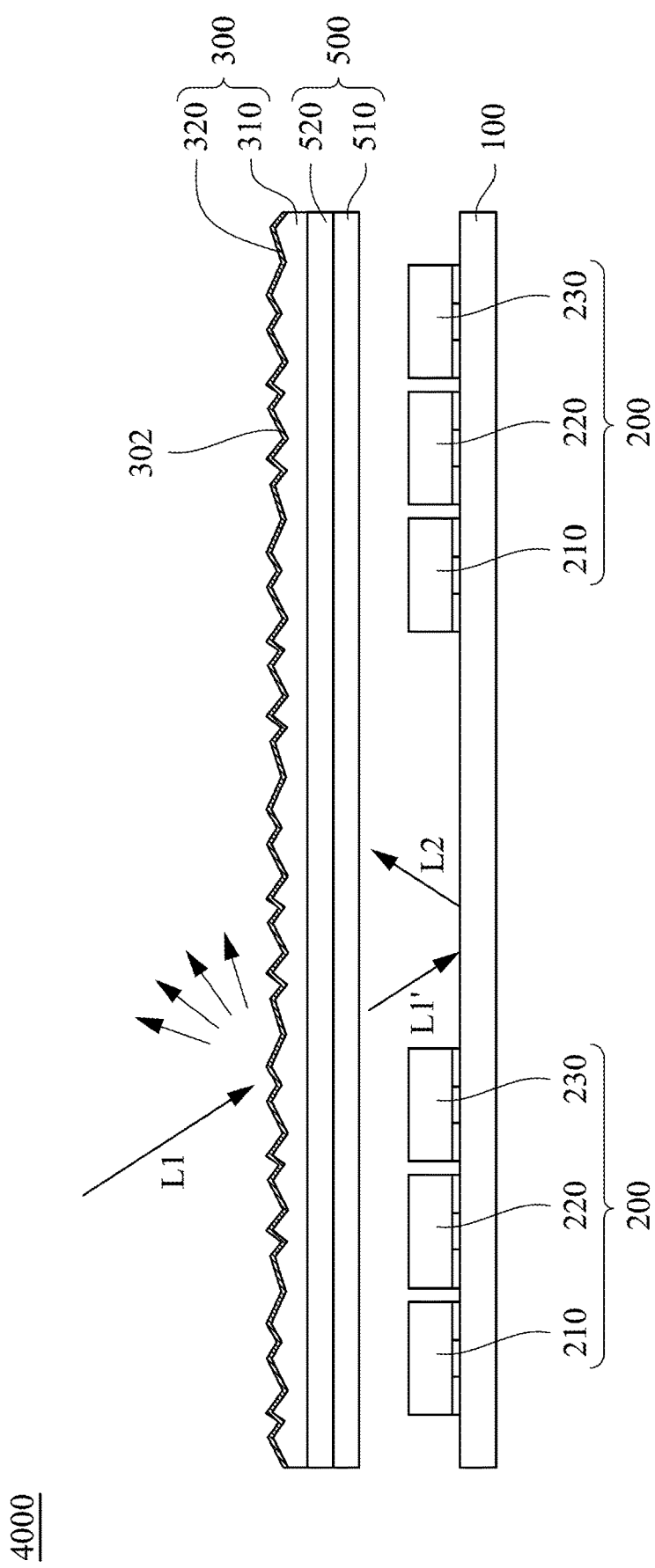
FIG. 4 is a schematic cross-sectional view of a display device in accordance with some embodiments of this invention.

Reference is made to FIG. 4, which is a schematic cross-sectional view of a display device 4000 in accordance with some embodiments of this invention. The difference between the display device 4000 and the display device 1000 is in that the display device 4000 further includes a circular polarizer layer 500 between the light-emitting member 200 and the glass layer 310. In some embodiments, the circular polarizer layer 500 includes a quarter-wave plate 510 and a linear polarizer 520. In some embodiments, the circular polarizer layer 500 may be applied to the display device 2000 with joint interface 110 shown in FIG. 2. The light-absorbing layer 320 can absorb a portion of the incident ambient light L1, such that the intensity of the reflected light may be reduced. Further, the incident ambient light L1 is scattered at the rough top surface 302 of the glass layer 310, such that a mirror reflection can be avoid. The incident light L1 through the anti-reflective glass layer 300 is converted into linear polarized light of 0° after passing through the linear polarizer 520. The linear polarized light of 0° is then converted into left-handed circular polarized light L1' after passing through the quarter-wave plate 510. The left-handed circular polarized light L1' is converted into right-handed circular polarized light L2 upon the reflection by the substrate 100. The right-handed circular polarized light L2 is then transmitted to the quarter-wave plate 510 and converted into linear polarized light of 90°, which cannot pass through the linear polarizer 520. The circular polarizer layer 500 can eliminate the reflection of the incident ambient light L1 so as to improve the display quality of the display device 4000. In some embodiments, the light-absorbing layer 320 may be optionally removed in the display device 4000.

In view of the above description, the display device disclosed herein is a novel display device, which can scatter the ambient light and decrease the intensity of the reflected light, and provide a good brightness or luminance. The display device includes an anti-reflective glass layer having a transmittance of 40-95% over the light-emitting member. The anti-reflective glass layer includes a glass layer having a rough top surface and a haze of 70-80%, and a light-absorbing layer on the rough top surface of the glass layer. The embodiments of the present invention discussed above have advantages over conventional display devices, and the advantages are summarized below. The light-absorbing layer can absorb a portion of the incident ambient light, such that the intensity of the reflected light may be reduced. Moreover, the incident ambient light can be scattered at the rough top surface of the glass layer, such that a mirror reflection can be avoid. The transmittance of the anti-reflective glass layer can be adjusted by changing the concentration of the light-absorbing particles dispersed in the light-absorbing layer. In addition, the anti-reflective glass layer can be applied to a spliced display device with multiple substrates, such that the joint interface between the substrates are visually imperceptible.

The following Examples are provided to illustrate certain aspects of the present invention and to aid those of skilled in the art in practicing this disclosure. These Examples are in no way to be considered to limit the scope of the invention in any manner.

Comparative Example 1: Display Device A1

In Comparative Example 1, the display device A1 includes a substrate, and a light-emitting member on the substrate. The light-emitting member includes red LED chips, green LED chips, and blue LED chips.

Comparative Example 2: Display Device A2
Having a Transparent Encapsulant Layer with a
Smooth Top Surface In Comparative Example 2, the display device A2 includes a substrate, a light-emitting member on the substrate, and a transparent encapsulant layer between thereof. The light-emitting member includes red LED chips, green LED chips, and blue LED chips. The transparent encapsulant layer covers the substrate and the light-emitting member, and surrounds each of the LED chips. The transparent encapsulant layer has a substantially smooth top surface and a thickness of 250 μm.

Comparative Example 3: Display Device A3 Having a Gray Encapsulant Layer with a Smooth Top Surface The display device A3 of the Comparative Example 3 is similar to the display device A2 of the Comparative Example 2, except that the transparent encapsulant layer with a smooth top surface is replaced by a gray encapsulant layer with a smooth top surface.

Comparative Example 4: Display Device A4 Having a Gray Encapsulant Layer with a Rough Top Surface The difference between the display device A4 of Comparative Example 4 and the display device A3 of Comparative Example 3 is in that the gray encapsulant layer of the display device A4 has a rough top surface.

Example 1: Display Device B1 with an Anti-Reflective Glass Layer Having a Transmittance of 92%

The display device includes a substrate, a light-emitting member on the substrate, and an anti-reflective glass layer over the light-emitting member (As shown in FIG. 1). The light-emitting member includes red LED chips, green LED chips, and blue LED chips. The anti-reflective glass layer has a transmittance of 92%, and includes a glass layer and a light-absorbing layer. The glass layer has a rough top surface and a haze of 75%. The light-absorbing layer is on the rough top surface of the glass layer. The distance between the top of the substrate and the bottom of the glass is about 250 μm.

Example 2: Display Device B2 with an Anti-Reflective Glass Layer Having a Transmittance of 92% and a Transparent Encapsulant Layer The difference between the display device B2 and the display device B1 is in that the display device B2 further includes a transparent encapsulant layer between the substrate and the glass layer (As shown in FIG. 3). The transparent encapsulant layer fills the space between the glass layer and the substrate. The transparent encapsulant layer of Example 2 is substantially the same as the transparent encapsulant layer of the display device A2 of the Comparative Example 2.

Example 3: Display Device B3 with an Anti-Reflective Glass Layer Having a Transmittance of 92% and a Gray Encapsulant Layer The display device B3 is similar to the display device B2, except that the transparent encapsulant layer is replaced by a gray encapsulant layer. The gray encapsulant layer of Example 3 is substantially the same as the gray encapsulant layer of the display device A3 of the Comparative Example 3.

Example 4: Display Device C1 with an Anti-Reflective Glass Layer Having a Transmittance of 68%

The difference between the display device C1 and the display device B1 is in that the anti-reflective glass layer of the display device C1 has a transmittance of 68%, and the glass layer has a haze of 77%.

Example 5: Display Device C2 with an Anti-Reflective Glass Layer Having a Transmittance of 68% and a Transparent Encapsulant Layer The difference between the display device C2 and the display device B2 is in that the anti-reflective glass layer of the display device C2 has a transmittance of 68%, and the glass layer has a haze of 77%.

Example 6: Display Device C3 with an Anti-Reflective Glass Layer Having a Transmittance of 68% and a Gray Encapsulant Layer The difference between the display device C3 and the display device B3 is in that the anti-reflective glass layer of the display device C3 has a transmittance of 68%, and the glass layer has a haze of 77%.

Example 7: Display Device D1 with an Anti-Reflective Glass Layer Having a Transmittance of 42%

The difference between the display device D1 and the display device B1 is in that the anti-reflective glass layer of the display device D1 has a transmittance of 42%, and the glass layer has a haze of 73%.

Example 8: Display Device D2 with an Anti-Reflective Glass Layer Having a Transmittance of 42% and a Transparent Encapsulant Layer The difference between the display device D2 and the display device B2 is in that the anti-reflective glass layer of the display device D2 has a transmittance of 42%, and the glass layer has a haze of 73%.

Example 9: Display Device D3 with an Anti-Reflective Glass Layer Having a Transmittance of 42% and a Gray Encapsulant Layer The difference between the display device D3 and the display device B3 is in that the anti-reflective glass layer of the display device D3 has a transmittance of 42%, and the glass layer has a haze of 73%.

Figure 5:
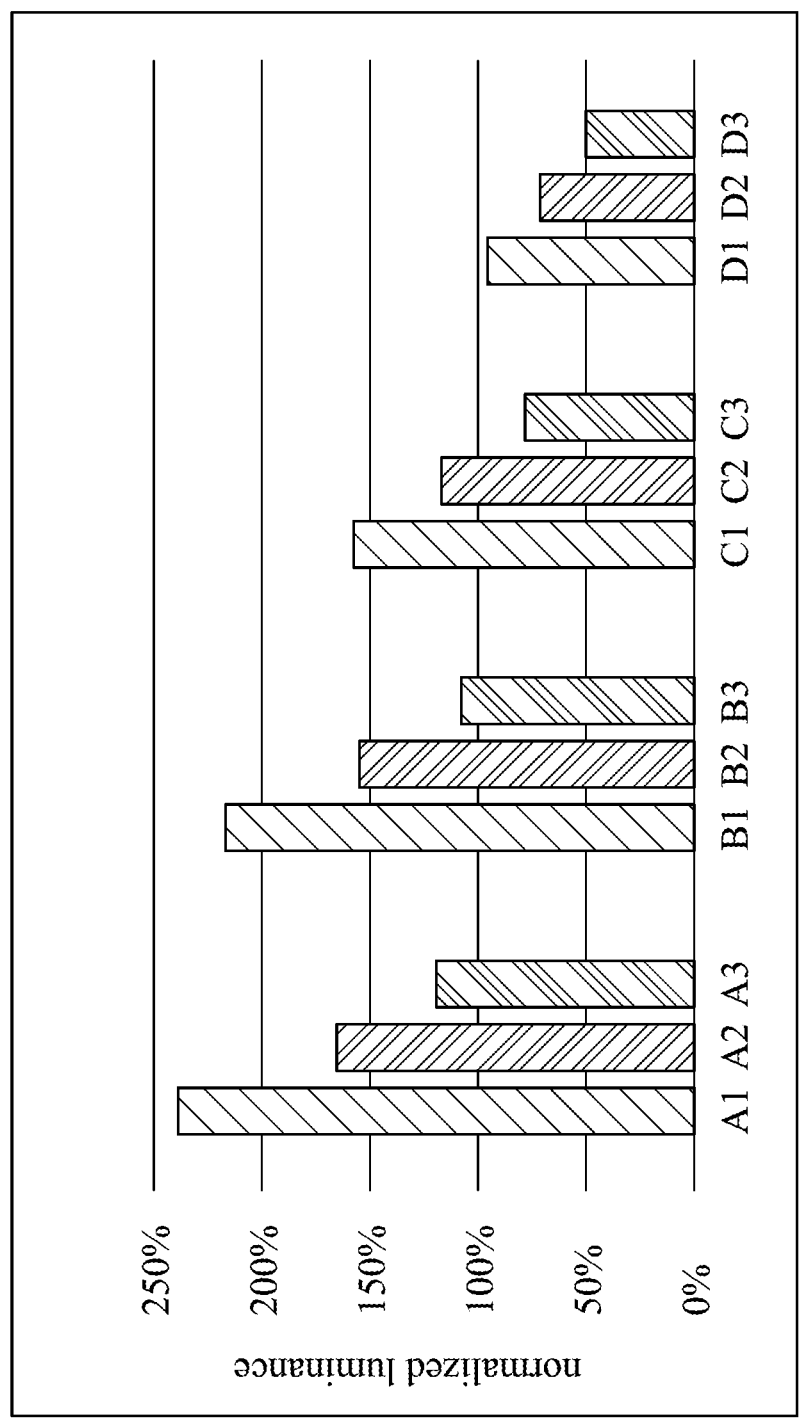
FIG. 5 is a bar chart of measurement results of luminance of various display devices in accordance with some embodiments of this invention.

FIG. 5 is a bar chart illustrating the measurement results of luminance of the above display devices. In FIG. 5, the measured luminance of the display device A4 is normalized to be 100%, which is used as the benchmark for comparing the luminance of the display devices A1-A3, B1-B3, C1-C3, and D1-D3.

Refer to FIG. 5. In the results the display devices A1-A3, the display device A1 has the highest luminance, the luminance of the display device A2 is relatively low, and the display device A3 with the gray encapsulant layer covering the LED chips has a luminance lower than A1 and A2. Compared with the display devices A4 having the gray encapsulant layer with a rough top surface, the display device A3 having the gray encapsulant layer with a smooth top surface has a higher luminance.

Each of the display devices B1-B3 includes an anti-reflective glass layer having a transmittance of 92% and a glass layer with a haze of 75%. As shown in FIG. 5, the luminance of the display devices B1-B3 has a decreasing tendency similar to the display devices A1-A3. In addition, the luminance of each of the display devices B1-B3 is higher than the display device A4.

Each of the display devices C1-C3 includes an anti-reflective glass layer having a transmittance of 68% and a glass layer with a haze of 77%. As shown in FIG. 5, the luminance of the display devices C1-C3 has a decreasing tendency similar to the display devices A1-A3 and B1-63. The luminance of the display devices C1-C3 is respectively lower than the display devices B1-B3 because of the decrease in the transmittance of the anti-reflective glass layer.

Each of the display devices D1-D3 includes an anti-reflective glass layer having a transmittance of 42% and a glass layer with a haze of 73%. As shown in FIG. 5, the luminance of the display devices D1-D3 has a decreasing tendency similar to the display devices C1-C3. The luminance of the display devices D1-D3 is respectively lower than the display devices C1-C3 because of the decrease in the transmittance of the anti-reflective glass layer. In addition, the luminance of each of the display devices D1-D3 is lower than the display device A4.

Figure 6:
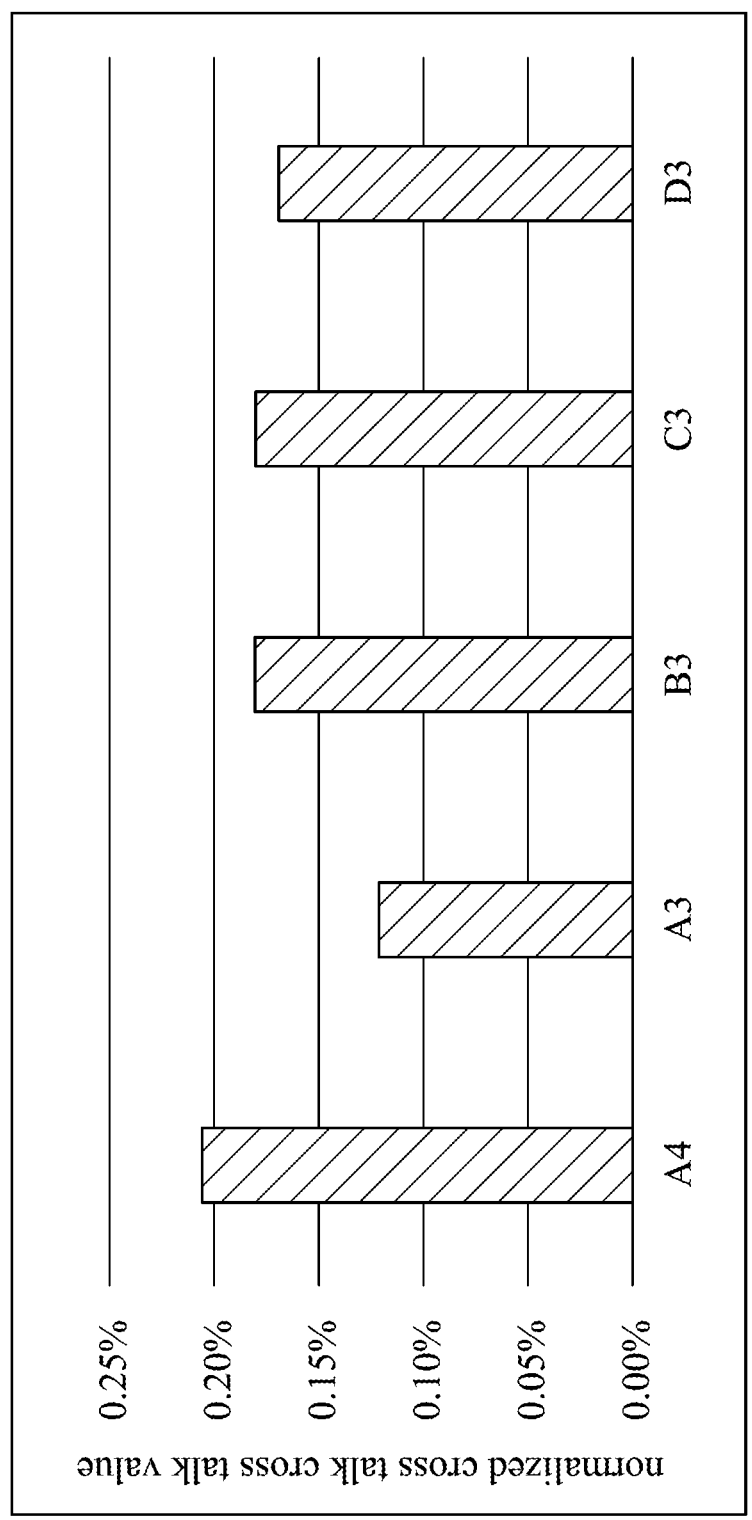
FIG. 6 is a bar chart of measurement results of cross talk of various display devices in accordance with some embodiments of this invention.

FIG. 6 is a bar chart showing the measurement results of cross talk of the above display devices. In FIG. 6, the cross talk value of the display device A4 is about 0.2%, which is used as the benchmark for comparing the cross talk of the display devices A3, B3, C3, and D3. The cross talk value of the display devices A3, B3, C3, and D3 are lower than the display devices A4, which means that the issue of cross talk can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a substrate;
   a light-emitting member on the substrate; and
   an anti-reflective glass layer over the light-emitting member, wherein the anti-reflective glass layer has a transmittance of 40-95% and comprises:
      a glass layer having a rough top surface and a haze of 70-80%;
      a light-absorbing layer on the rough top surface of the glass layer; and
      a gray encapsulant layer between the light-emitting member and the glass layer, and surrounding the light-emitting member, wherein the gray encapsulant layer comprises an encapsulating material and a plurality of second light-absorbing particles dispersed in the encapsulating material, and the second light-absorbing particles is present in the encapsulating material at a weight percentage of about 0.1-0.5%.

2. The display device of claim 1, wherein the light-emitting member comprises a red LED chip, a green LED chip, and a blue LED chip.

3. The display device of claim 1, wherein a top of the light-emitting member is spaced apart from a bottom of the glass layer by a gap ranged from 100 μm to 150 μm.

4. The display device of claim 1, wherein the light-absorbing layer comprises a polymer and a plurality of first light-absorbing particles dispersed in the polymer.

5. The display device of claim 1, further comprising a circular polarizer layer between the light-emitting member and the glass layer.

6. The display device of claim 1, further comprising a transparent encapsulant layer between the light-emitting member and the glass layer, and surrounding the light-emitting member.

7. A display device, comprising:
   a first substrate and a second substrate neighboring the first substrate, wherein a joint interface is present between the first substrate and the second substrate;
   a first light-emitting member and a second light-emitting member respectively disposed on the first substrate and the second substrate; and
   an anti-reflective glass layer over the first and the second light-emitting members, wherein the anti-reflective glass layer has a transmittance of 40-95% and comprises:
      a glass layer covering the first light-emitting member, the second light-emitting member, and the joint interface, wherein the glass layer has a rough top surface and a haze of 70-80%;
      a light-absorbing layer on the rough top surface of the glass layer; and
      a gray encapsulant layer between the first and the second light-emitting members and the glass layer, and surrounding the first and the second light-emitting members, wherein the gray encapsulant layer comprises a encapsulating material and a plurality of second light-absorbing particles dispersed in the encapsulating material and the second light-absorbing particles is present in the encapsulating material at a weight percentage or about 0.1-0.5%.

8. The display device of claim 7, wherein each of the first light-emitting member and the second light-emitting member comprises a red LED chip, a green LED chip, and a blue LED chip.

9. The display device of claim 7, wherein a top of the first light-emitting member and a top of the second light-emitting member is respectively spaced apart from a bottom of the glass layer by a gap ranged from 100 μm to 150 μm.

10. The display device of claim 7, wherein the light-absorbing layer comprises a polymer and a plurality of first light-absorbing particles dispersed in the polymer.

11. The display device of claim 7, further comprising a circular polarizer layer between the first and the second light-emitting members and the glass layer.

12. The display device of claim 7, further comprising a transparent encapsulant layer between the first and the second light-emitting members and the glass layer, and surrounding the first and the second light-emitting members.

* * * * *